United States Patent
Koiima (10) Patent No.: US 7,847,576 B2
(45) Date of Patent: Dec. 7, 2010

(54) COMPARATOR WITH LATCHING FUNCTION

(75) Inventor: Shoji Koiima, Tokyo (JP)

(73) Assignee: Advantest Corporation, Tokyo (JP)

(*) Notice: Subject to any disclaimer, the term of this patent is extended or adjusted under 35 U.S.C. 154(b) by 102 days.

(21) Appl. No.: 12/394,018

(22) Filed: Feb. 26, 2009

(65) Prior Publication Data

US 2010/0213966 A1 Aug. 26, 2010

(51) Int. Cl.
*G01R 31/26* (2006.01)

(52) U.S. Cl. .................. 324/765; 327/63; 327/65

(58) Field of Classification Search .............. None
See application file for complete search history.

(56) References Cited

U.S. PATENT DOCUMENTS

| | | | |
|---|---|---|---|
| 4,461,965 A | 7/1984 | Chin | 307/530 |
| 4,485,317 A | 11/1984 | Davies, Jr. | 307/475 |
| 4,558,241 A | 12/1985 | Suzuki et al. | 307/530 |
| 4,608,670 A | 8/1986 | Duvvury et al. | 365/205 |
| 4,641,246 A * | 2/1987 | Halbert et al. | 341/163 |
| 6,211,705 B1 | 4/2001 | Bruccoleri et al. | 327/57 |
| 6,608,503 B2 * | 8/2003 | Shenai et al. | 327/77 |

* cited by examiner

*Primary Examiner*—Minh N Tang
(74) *Attorney, Agent, or Firm*—Martine Penilla & Gencarella LLP (57) ABSTRACT

A comparison amplification unit compares a level of a signal in a positive line with that of a signal in a negative line and latches a comparison result. An input terminal of a first inverter is connected to the positive line and an output terminal thereof is connected to the negative line. An input terminal of a second inverter is connected to the negative line and an output terminal thereof is connected to the positive line. An activation switch selectively switches between a state where the activation switch outputs a power supply voltage to the other power supply terminals of the inverters that are connected in common, such that the comparison amplification unit is inactivated, and a state where the activation switch outputs the ground voltage such that the comparison amplification is activated. The comparator outputs a signal corresponding to at least one of the signal in the positive line and the signal in the negative line at a timing after the comparison amplification unit is activated.

14 Claims, 11 Drawing Sheets

COMPARATOR WITH LATCHING FUNCTION

BACKGROUND OF THE INVENTION

1. Field of the Invention

The present invention relates to a comparator with a latching function that determines a level of a differential signal.

2. Description of the Related Art

Differential signals are used for transmitting a signal between semiconductor devices at a high speed. A test apparatus for testing a semiconductor device with a differential interface is provided with a comparator (timing comparator) that receives a differential signal outputted from the semiconductor device to be tested (hereinafter, referred to as a DUT: Device Under Test) and that performs a comparison/determination of a value of the signal at a certain timing and latches a comparison/determination result. The test apparatus determines whether the DUT is good or not, specifies a defective portion, or evaluates its performance, based on an output signal from the timing comparator.

The data transmission rate between semiconductor devices keeps on increasing in recent years, and the response speed needed for a test apparatus is increasing in accordance with it. Accordingly, a timing comparator is needed to have a higher-speed response with higher gain than before.

A comparator with a latching function is disclosed in FIG. 1 of Patent Document 1. The comparator comprises a first-stage differential amplifier and a latch circuit latching an output from the amplifier. With the structure, there is a problem that the range of an input voltage may be narrower as compared with that of a power supply voltage of a differential amplifier. When using a Rail-to-Rail amplifier performing in the full range between the power supply voltage and the ground voltage to deal with the problem, an operation speed is decreased in exchange for that. In addition, when a potential difference between the two input signals is small, there is a possibility that a circuit is unstable to cause an oscillation. When hysteresis is supplied thereto to deal with that, a deadband occurs in exchange for that, causing the sensitivity to be decreased.

(Patent Document 1) U.S. Pat. No. 6,211,705B1, Description (Patent Document 2) U.S. Pat. No. 4,558,241, Description (Patent Document 3) U.S. Pat. No. 4,608,670, Description (Patent Document 4) U.S. Pat. No. 4,461,965, Description (Patent Document 5) U.S. Pat. No. 4,485,317, Description

SUMMARY OF THE INVENTION

The present invention has been made under these circumstances, and one of the exemplary purposes of an embodiment of the invention is to provide a comparator with a latching function that has a high-speed response.

An embodiment of the present invention relates to a comparator that receives a pair of differential signals consisting of a positive differential signal and a negative differential signal, and that determines an amplitude level of the pair of differential signals at a predetermined timing and latches a determination result. The comparator with a latching function comprises: a positive input terminal to which the positive differential signal is inputted; a negative input terminal to which the negative differential signal is inputted; a first fixed voltage terminal to which a first fixed voltage is supplied; a second fixed voltage terminal to which a second fixed voltage is supplied; a positive line in which the positive differential signal is propagated; a negative line in which the negative differential signal is propagated; and a comparison amplification unit that compares a level of the signal in the positive line with that of the signal in the negative line and latches a comparison result, wherein the comparison amplification unit includes: a first inverter, an input terminal of which is connected to the positive line, an output terminal of which is connected to the negative line, and a power supply terminal on one side of which is connected to the first fixed voltage terminal; a second inverter, an input terminal of which is connected to the negative line, an output terminal of which is connected to the positive line, and a power supply terminal on one side of which is connected to the first fixed voltage terminal; and a first activation switch that can selectively switch between the state where the comparison amplification unit is inactivated by outputting the first fixed voltage to the other power supply terminals of the first and second inverters that are connected in common and the state where the comparison amplification unit is activated by outputting the second fixed voltage. The comparator outputs a signal corresponding to at least one of the signal in the positive line and the signal in the negative line at a timing after the comparison amplification unit is activated.

According to the embodiment, a high-speed response can be realized by using a dynamic comparator as a comparison amplification unit.

Another embodiment of the present invention relates to a test apparatus provided with the aforementioned comparator with a latching function. The comparator with a latching function receives a differential signal outputted from a device under test, and determines a value of the signal at a specified timing.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
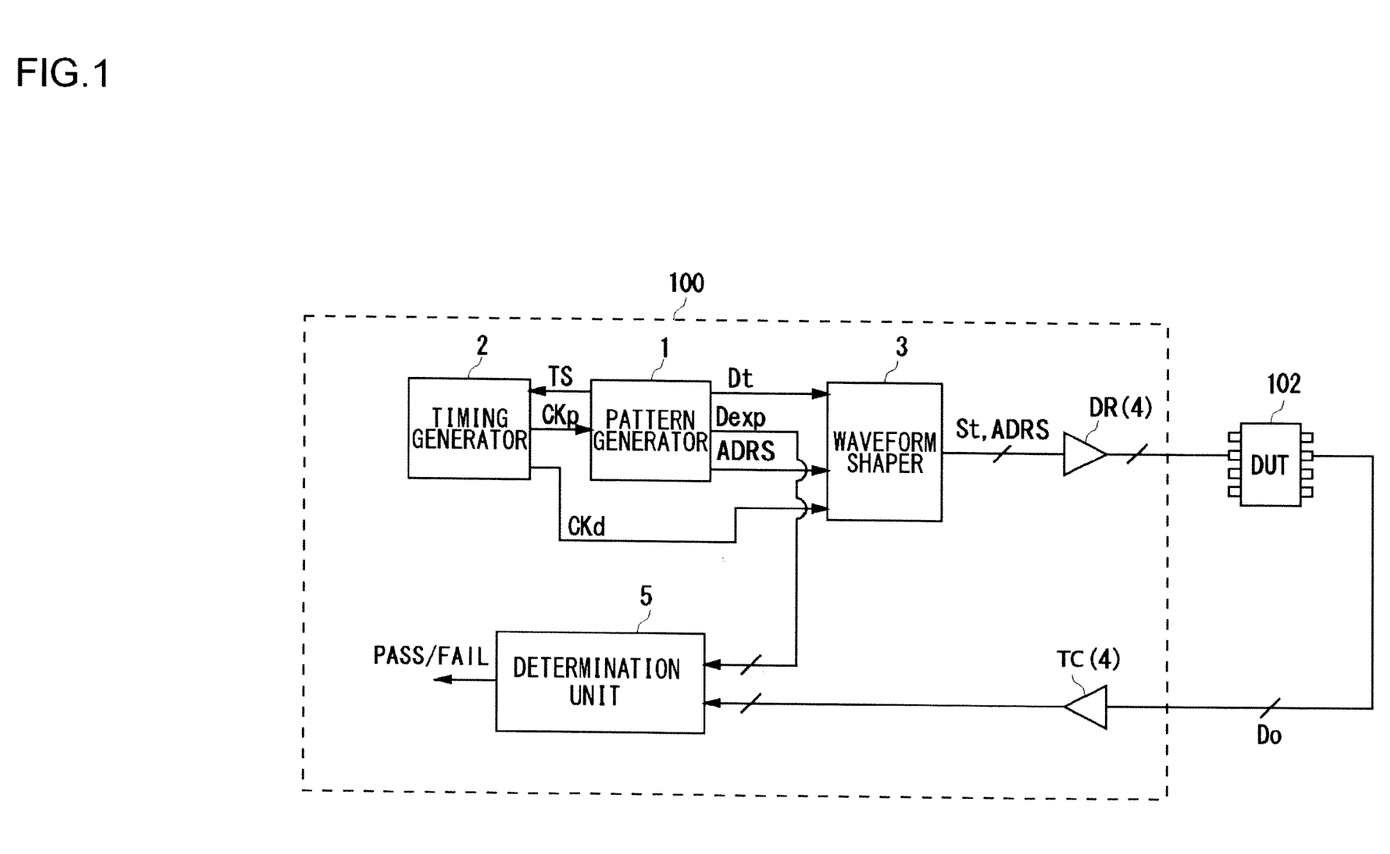
FIG. 1 is a block diagram illustrating the whole structure of an ATE according to an embodiment.

Herein, "the state where a member A is connected to a member B" includes not only the state where the member A is physically and directly connected to the member B but also the state where the member A is indirectly connected to the member B via another member that does not affect electrically the connection state between them. Likewise, "the state where a member C is provided between a member A and a member B" includes not only the state where the member A and the member C, or the member B and the member C, are connected directly, but also the state where they are connected indirectly via another member that does not affect electrically the connection state between them An embodiment described below relates to Automatic Test Equipment (ATE) for testing a device under test (DUT) with a differential interface. FIG. 1 is a block diagram illustrating the whole structure the ATE 100 according to the embodiment.

The ATE 100 is connected to the DUT 102 via a differential transmission line. The ATE 100 receives a pair of differential signals (also simply referred to as a differential signal) Do outputted from the DUT 102, and determines a level thereof at any timing. The DUT 102 is, for example, a memory, and the ATE 100 has a function of determining whether the DUT 102 is good, or of specifying a defective portion thereof. However, the DUT is not limited to a memory but any device.

The ATE 100 comprises a pattern generator (PG) 1, a timing generator (TG) 2, a waveform shaper (FC: Format Controller) 3, a driver DR, a comparator (also referred to as a timing comparator) TC, and a determination unit 5. The driver DR and the comparator TC are collectively referred to as pin electronics 4. It is noted that the structure of the ATE 100 is merely an example, and architectures different therefrom may be adopted.

The pattern generator 1 generates a timing-set signal (hereinafter, referred to as a "TS signal") and supplies it to the timing generator 2. The timing generator 2 generates a periodic clock CKp and a delay clock CKd based on the timing data specified by the TS signal, and supplies the periodic clock CKp to the pattern generator 1 and the delay clock CKd to the waveform shaper 3, respectively. The pattern generator 1 generates addresses ADRS indicating each of the blocks, which are a plurality of memory areas the DUT 102 has, and a plurality of test pattern data items Dt that are to be written in each of the plurality of blocks, and supplies them to the waveform shaper 3.

The waveform shaper 3 generates a test pattern signal St corresponding to the test pattern data Dt generated by the pattern generator 1, based on the delay clock CKd supplied by the timing generator 2. The waveform shaper 3 supplies the addresses ADRS, which are supplied by the pattern generator 1, and the test pattern signal St thus generated to the DUT 102 via a write driver DR.

The pattern generator 1 generates in advance expectation data Dexp, data to be outputted by the DUT 102 in accordance with the addresses ADRS and the test pattern signal St, and supplies the data to the determination unit 5.

The comparator TC receives from the DUT 102 a differential signal Do corresponding to the addresses ADRS and determines a level of the signal at any predetermined timing such that the comparator TC latches a determination result and outputs it to the determination unit 5 in the subsequent stage. The determination unit 5 compares a level of the data Do read by the DUT 102 with that of the expectation data Dexp supplied by the pattern generator 1, such that it is determined whether the DUT 102 is good.

Figure 2:
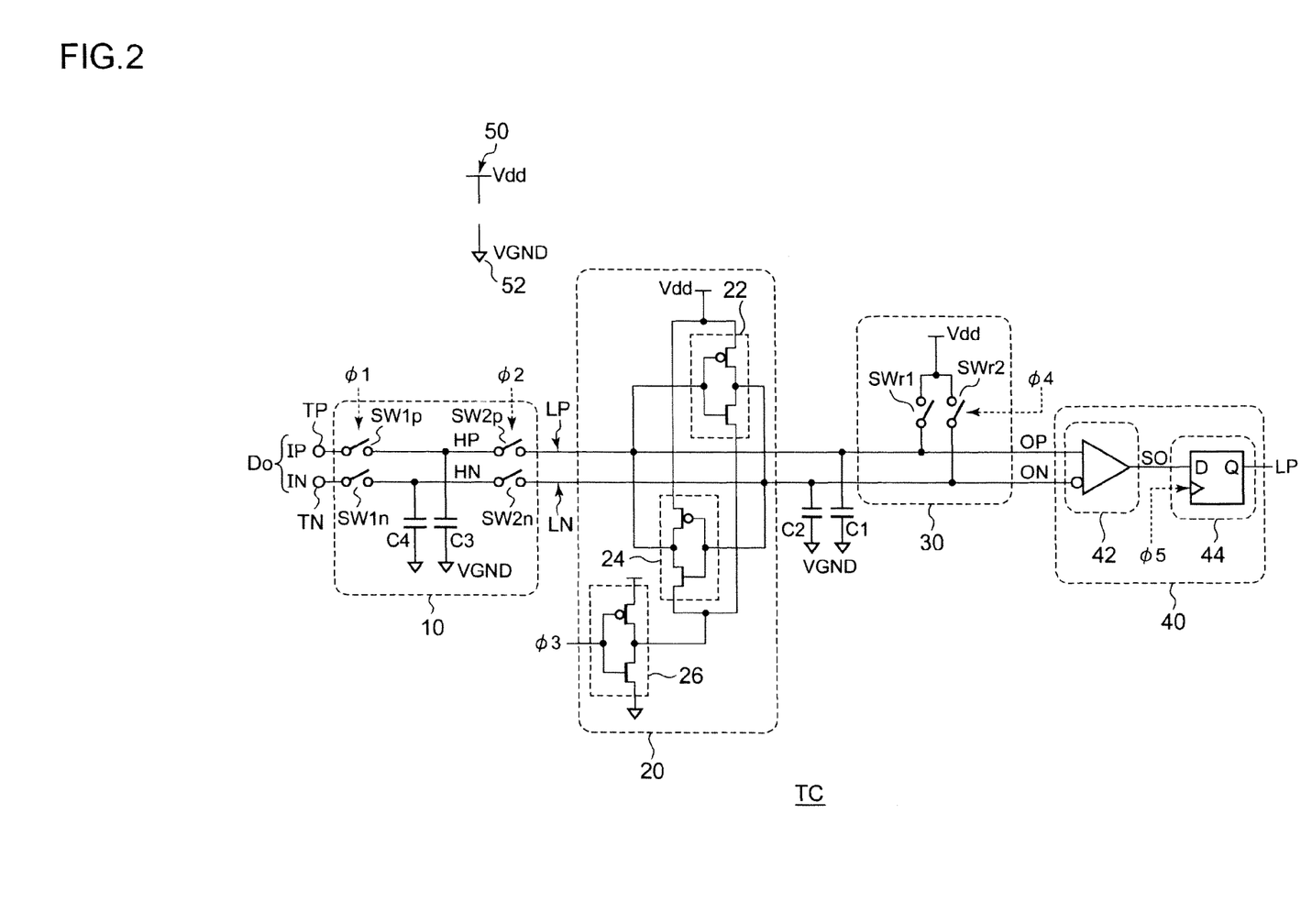
FIG. 2 is a circuit diagram illustrating the structure of a comparator with a latching function according to the embodiment.

FIG. 2 is a circuit diagram illustrating the structure of the comparator TC with a latching function according to the embodiment. The comparator TC is suitably applicable to the comparator TC in FIG. 1, and further applicable to other uses.

The comparator TC receives differential signals Do consisting of a negative differential signal IN and a positive differential signal IP, and determines an amplitude level of the differential signals Do at a timing set by a control signal ($\phi$3), and latches a signal indicating a determination result.

The comparator TC comprises an input hold unit 10, a comparison amplification unit 20, a reset unit 30, an output unit 40, and capacitors of a first capacitor C1 to a fourth capacitor C4.

A positive differential signal IP is inputted to the positive input terminal TP and a negative differential signal IN is inputted to the negative input terminal TN. The power supply terminal 50 (first fixed voltage terminal) is supplied with a power supply voltage Vdd as a first fixed voltage, and a ground terminal 52 (second fixed voltage terminal) is supplied with a ground voltage VGND as a second fixed voltage.

The positive differential signal IP (signal HP held by the input hold unit 10) is propagated through the positive line LP. The negative differential signal IN (signal HN held by the input hold unit 10) is propagated through the negative line LN.

The comparison amplification unit 20 includes a first inverter 22, a second inverter 24, and an activation switch 26. The comparison amplification unit 20 is structured with a form referred as a dynamic comparator or sense latch.

The first inverter 22, the second inverter 24, and the activation switch 26 are CMOS inverters. An input terminal of the first inverter 22 is connected to the positive line LP, and an output terminal thereof to the negative line LN. A power supply terminal (source of a PMOS) on one side of the first inverter 22 is connected to the power supply terminal 50 (first fixed voltage terminal).

An input terminal of the second inverter 24 is connected to the negative line LN, and an output terminal thereof to the positive line LP. A power supply terminal (source of the PMOS) on one side of the second inverter 24 is connected to the power supply terminal (first fixed voltage terminal) 50. The other power supply terminal (source of a NMOS) is connected in common to the other power supply terminal (source of the NMOS) of the first inverter 22. That is, the first inverter 22 and the second inverter 24 are cross-coupled.

The activation switch 26 applies the power supply voltage (first fixed voltage) Vdd or the ground voltage (second fixed voltage) VGND to the other power supply terminals (sources of the NMOS) of the first and second inverters 22 and 24 that are connected in common. A third control signal $\phi$3 is inputted to the input terminal of the activation switch 26.

While the third control signal $\phi$3 is being negated (low level), an output voltage from the activation switch 26 is equal to the first fixed voltage (power supply voltage Vdd), allowing the first and second inverters 22 and 24 to be inactivated. When the third control signal $\phi$3 is asserted (high level), an output voltage from the activation switch 26 is equal to the second fixed voltage (ground voltage VGND), allowing the first and second inverters 22 and 24 to be activated.

The first capacitor C1 and the second capacitor C2 are coupled to the positive line LP and the negative line LN, respectively. The first capacitor C1 and the second capacitor C2 may be formed explicitly by using an MIM (Metal Insulator Metal) capacitance; however, when the capacitance values thereof are proper, they may also be formed by using the parasitic capacitance (gate capacitance of transistor and wiring capacitance). In addition, the first capacitor C1 is provided between the positive line LP and the grounding, and the second capacitor C2 between the negative line LN and the grounding; however, the positive line LP and the negative line LN may also be coupled by a single capacitor.

The input hold unit 10 is provided in the stage preceding the comparison amplification unit 20. The input hold unit 10 has a function of electrically separating the input terminal of the comparison amplification unit 20, the positive input terminal TP, and the negative input terminal TN. The input hold terminal 10 holds the differential signals IP/IN at a timing specified by the first control signal $\phi 1$. And then, the input hold unit 10 outputs the differential signals HN/HP thus held to the comparison amplification unit 20 in the subsequent stage.

The input hold unit 10 includes a first positive switch SW1$p$, a second positive switch SW2$p$, a first negative switch SW1$n$, a second negative switch SW2$n$, a third capacitor C3, and a fourth capacitor C4.

The first positive switch SW1$p$ and the second positive switch SW2$p$ are provided in series between the positive input terminal TP and the positive line LP. The third capacitor C3 couples a path between the first positive switch SW1$p$ and the second positive switch SW2$p$ and the ground. The first positive switch SW1$p$ is turned on when the first control signal $\phi 1$ is asserted (high level), and the second positive switch SW2$p$ is turned on when the second control signal $\phi 2$ is asserted (high level). In the state where the first positive switch SW1$p$ is on and the second positive switch SW2$p$ is off, a potential of the third capacitor C3 (positive hold signal HP) follows the positive differential signal IP. When the control signal $\phi 1$ is negated (low level) at a certain timing, the first positive switch SW1$p$ is turned off and the positive differential signal IP at the timing is held by the third capacitor C3. When the second control signal $\phi 2$ is asserted and the second positive switch SW2$p$ is turned on, the positive hold signal I-IP thus held is supplied to the positive line LP.

The first negative switch SW1$n$, the second negative switch SW2$n$ and the fourth capacitor C4 are also connected in the same way to hold the negative differential signal IN.

In the same way as the first capacitor C1 and the second capacitor C2, the third capacitor C3 and the fourth capacitor C4 may also be farmed by using an MIM capacitance or the parasitic capacitance. Instead of providing the third capacitor C3 and the fourth capacitor C4, the line in which the positive hold signal HP is generated and the line in which the negative hold signal HN is generated may be coupled by a single capacitor.

When the circuit in the stage preceding the positive input terminal TP and the negative input terminal TN has a property by which a signal to be inputted to the comparison amplification unit 20 is switched off, in other words, when a signal in the positive line LP or the negative line LN does not affect the circuit in the preceding stage, the input hold unit 10 itself or some switches within the input hold unit 10 can be omitted.

The reset unit 30 is provided to initialize the potential of the positive line LP (positive output signal OP) and that of the negative line LN (negative output signal ON) to the first fixed voltage (power supply voltage Vdd). Specifically, the reset unit 30 includes a first reset switch SWr1 and a second reset switch SWr2. The first reset switch SWr1 is provided between the positive line LP and the power supply terminal 50 (first fixed voltage terminal). The second reset switch SWr2 is provided between the negative line LN and the power supply terminal 50. The first reset switch SWr1 and the second reset switch SWr2 are turned on when the fourth control signal $\phi 4$ is asserted (high level), and turned off when the fourth control signal is negated (low level). When the first reset switch SWr1 and the second reset switch SWr2 are turned on, the potentials of the positive line LP and the negative line LN are immediately reset to the first fixed voltage (power supply voltage Vdd).

Even when the first reset switch SWr1 and the second reset switch SWr2 are not turned on, the potentials of the positive line LP and the negative line LN are, although slightly, pulled toward the power supply voltage Vdd by a transistor included in the comparison amplification unit 20. Accordingly, if the comparator TC operates sufficiently at a low speed, the reset unit 30 can be omitted.

The output unit 40 includes a comparator element 42 and a latch circuit 44. The comparator 42 compares the positive output signal OP with the negative output signal ON and converts the result to a single-end signal (SO). The latch circuit 44 latches, when the fifth control signal $\phi 5$ is asserted (high level), the value of the output signal SO. The latched signal LP is outputted to a logic block in the subsequent stage. The output unit 40 only has to convert the SO signal to that with a signal form suitable for the circuit in the subsequent stage and to retime the signal; hence the circuit form thereof is not limited. In addition, because the output unit 40 is a component appendant to the comparator TC, the unit may be omitted.

Figure 3:
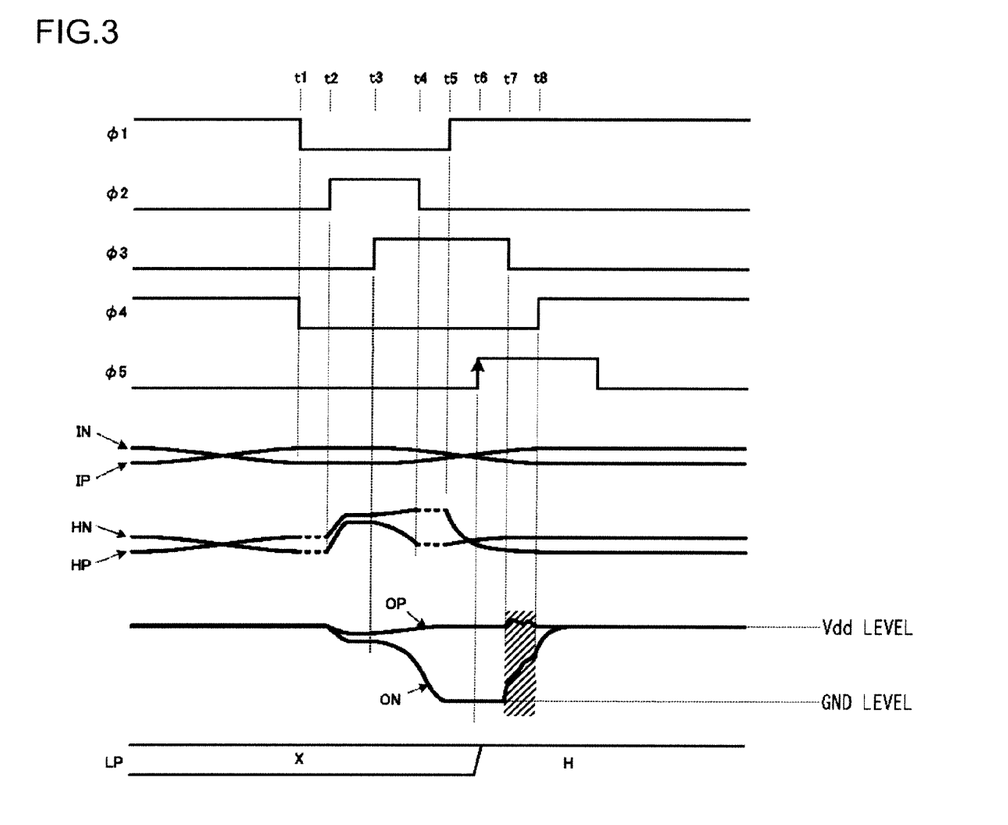
FIG. 3 is a time chart illustrating performance of the comparator in FIG. 2.

The structure of the comparator TC in FIG. 2 has been described above. Subsequently, the performance thereof will be described. FIG. 3 is a time chart illustrating the performance of the comparator TC in FIG. 2. In the following time charts, "X" indicates Invalid.

Before the time t1, because the first control signal $\phi 1$ is at the high level and the second control signal $\phi 2$ is at the low level, the input hold unit 10 performs in a tracking mode and the hold signals HP/HN follow the input signals IP/IN. Because the third control signal $\phi 3$ is at the low level during this period, the comparison amplification unit 20 is inactivated. Further, because the fourth control signal $\phi 4$ is at the high level, the potentials of the positive line LP and the negative line LN are fixed to the power supply voltage Vdd by the reset unit 30.

When the first control signal $\phi 1$ makes a transition to the low level at the time t1, the values of the hold signals HP/HN are held to those at the time t1. At the time, the fourth control signal $\phi 4$ is at the low level, allowing a reset by the reset unit 30 to be released.

When the control signal $\phi 2$ make a transition to the high level at the subsequent time t2, the second positive switch SW2$p$ is turned on, and charges are transferred between the first and third capacitors C1 and C3, allowing the potentials OP and HP to be averaged. The same is true for the negative line.

Subsequently, when the third control signal $\phi 3$ makes a transition to the high level at the time t3, an output signal from the activation switch 26 has a voltage equal to the ground voltage VGND, allowing the comparison amplification unit 20 to be activated. When the comparison amplification unit 20 is activated, a potential difference between the positive output signal OP and the negative output signal ON expands to reach its saturation.

Subsequently, when the second control signal φ2 makes a transition to the low level at the time t4, the third and fourth capacitors C3 and C4 are separated from the comparison amplification unit 20.

Subsequently, when the first control signal φ1 makes a transition to the high level at the time t5, the input hold unit 10 is brought back to the tracking mode.

Subsequently, when the fifth control signal φ5 makes a transition to the high level at the time t6, a signal corresponding to the positive output signal OP and the negative output signal ON, that is, an output signal from the comparator 42 is latched. The fifth control signal φ5 is later to be negated at an appropriate timing.

When the third control signal φ3 makes a transition to the low level at the time t7, the comparison amplification unit 20 is inactivated. During the period between the times t7 and t8 (hatched period), the potential of the positive line LP (negative line LN) is slightly pulled toward the power supply voltage Vdd by the comparison amplification unit 20 in the inactivated state.

Subsequently, when the fourth control signal φ4 makes a transition to the high level at the time t8, the positive output signal OP and the negative output signal ON are fixed to the power supply voltage Vdd by the reset unit 30 (reset performance). This state is the same as that before the time t1. The comparator TC subsequently repeats the same performance.

According to the comparator TC, the input signals IP/IN can be sampled at a high speed at a desired timing. Specifically, the comparator can follow a signal with a 100-ps cycle time (10 GHz). In addition, because the comparison amplification unit 20 is provided with a dynamic comparator, the comparator has a very high sensitivity (high gain) and is tolerant of self-oscillation. Furthermore, the comparator can receive the differential signals IP/IN swinging from the ground voltage VGND to the power supply voltage Vdd (Rail-to-rail input).

Subsequently, some variations of the comparator derived from the structure in FIG. 2 will be described.

(First Variation)

Figure 4:
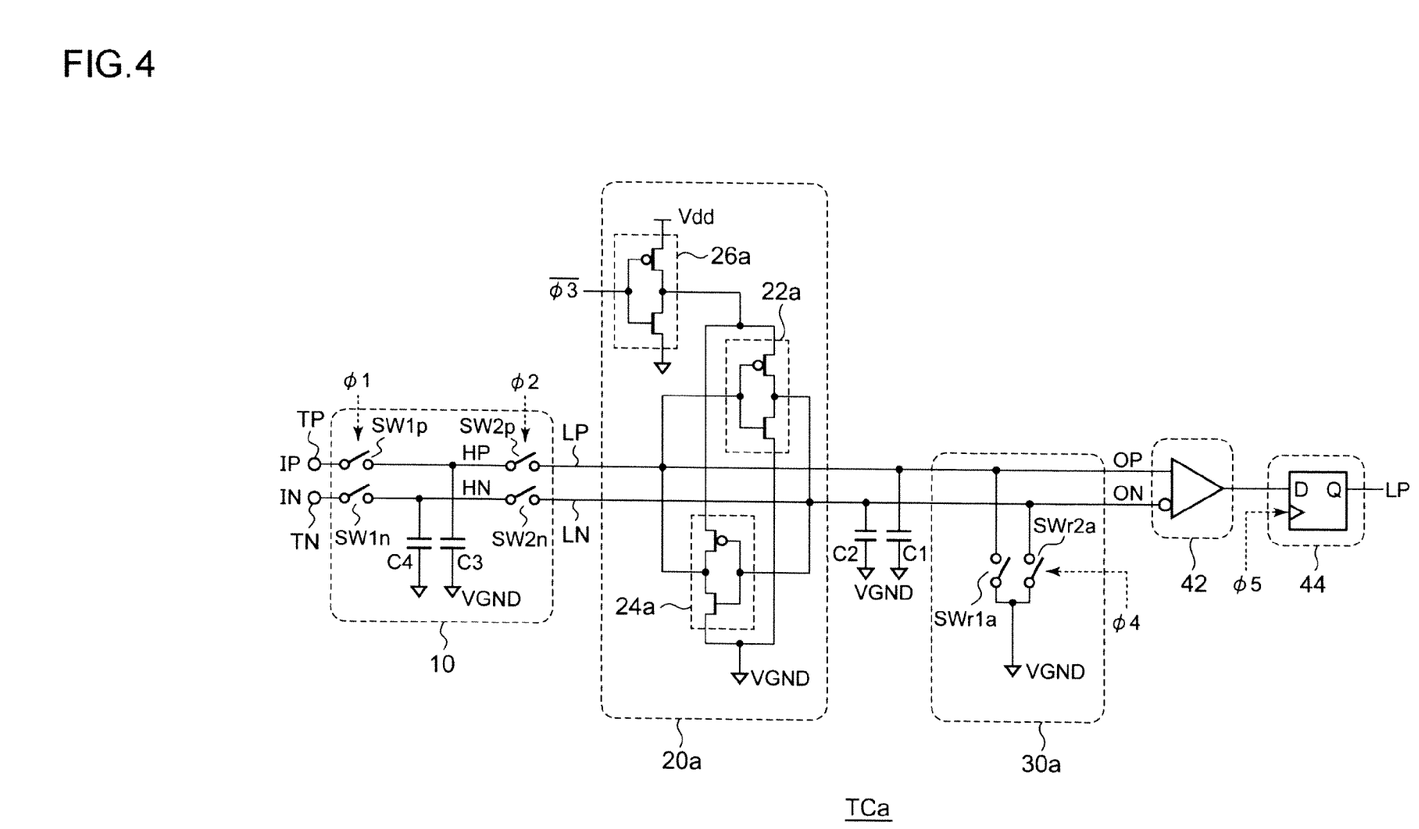
FIG. 4 is a circuit diagram illustrating the structure of the comparator according to a first variation.

FIG. 4 is a circuit diagram illustrating a structure of a comparator TCa according to a first variation. The description will be made centering on differences from FIG. 2. In the comparator TCa illustrated in FIG. 4, the structures of the comparison amplification unit 20a and the reset unit 30a are different from those in FIG. 2.

Specifically, one power supply terminal (source of NMOS) of a first inverter 22a is connected to a ground terminal 52 (first fixed voltage terminal). One power supply terminal (source of NMOS) of a second inverter 24a is connected to the ground terminal (first fixed voltage) 52, and the other power supply terminal (source of PMOS) is connected in common to the other power supply terminal (source of PMOS) of the first inverter 22a.

An activation switch 26 applies a power supply voltage (second fixed voltage) Vdd or the ground voltage (first fixed voltage) VGND to the other power supply terminals (sources of PMOS) of the first and second inverters 22a and 24a, which are connected in common). A third control signal φ3# (# indicates a logic inversion) is inputted to the input terminal of the activation switch 26a.

While the third control signal φ3# is being negated (high level), an output voltage from the activation switch 26a is equal to the first fixed voltage (ground voltage VGND), allowing the first and second inverters 22a and 24a to be inactivated. When the third control signal φ3# is asserted (low level), an output voltage from the activation switch 26a is equal to the second fixed voltage (power supply voltage Vdd), allowing the first and second inverters 22a and 24a to be activated.

The reset unit 30a is provided to initialize potentials of the positive line LP (positive output signal OP) and the negative line LN (negative output signal ON) to the first fixed voltage (ground voltage VGND). Specifically, the reset unit 30 includes a first reset switch SWr1a provided between the positive line LP and the ground terminal 52 (first fixed voltage terminal) and a second reset switch SWr2a provided between the negative line LN and the ground terminal 52 (first fixed voltage terminal).

In other words, the first fixed voltage is equal to the power supply voltage Vdd and the second fixed voltage is equal to the ground voltage VGVD in the structure of FIG. 2; in contrast, the first fixed voltage is changed to the ground voltage VGND and the second fixed voltage is changed to the power supply voltage Vdd in the structure of FIG. 4.

Figure 5:
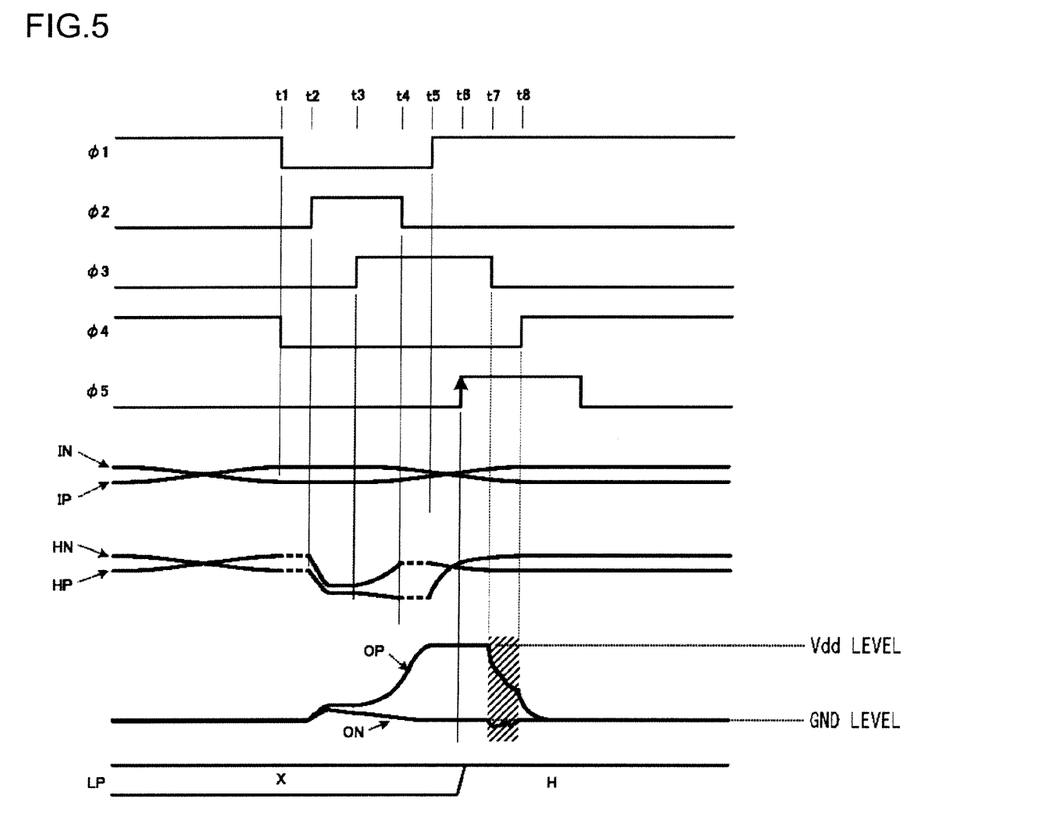
FIG. 5 is a time chart illustrating performance of the comparator in FIG. 4.

FIG. 5 is a time chart illustrating the performance of the comparator TCa in FIG. 4. The time chart in the drawing is the same as that in FIG. 3 for the transition timings of each signal excluding the voltage level. Also with this variation, the same result as the basic structure in FIG. 2 can be obtained.

Figure 6:
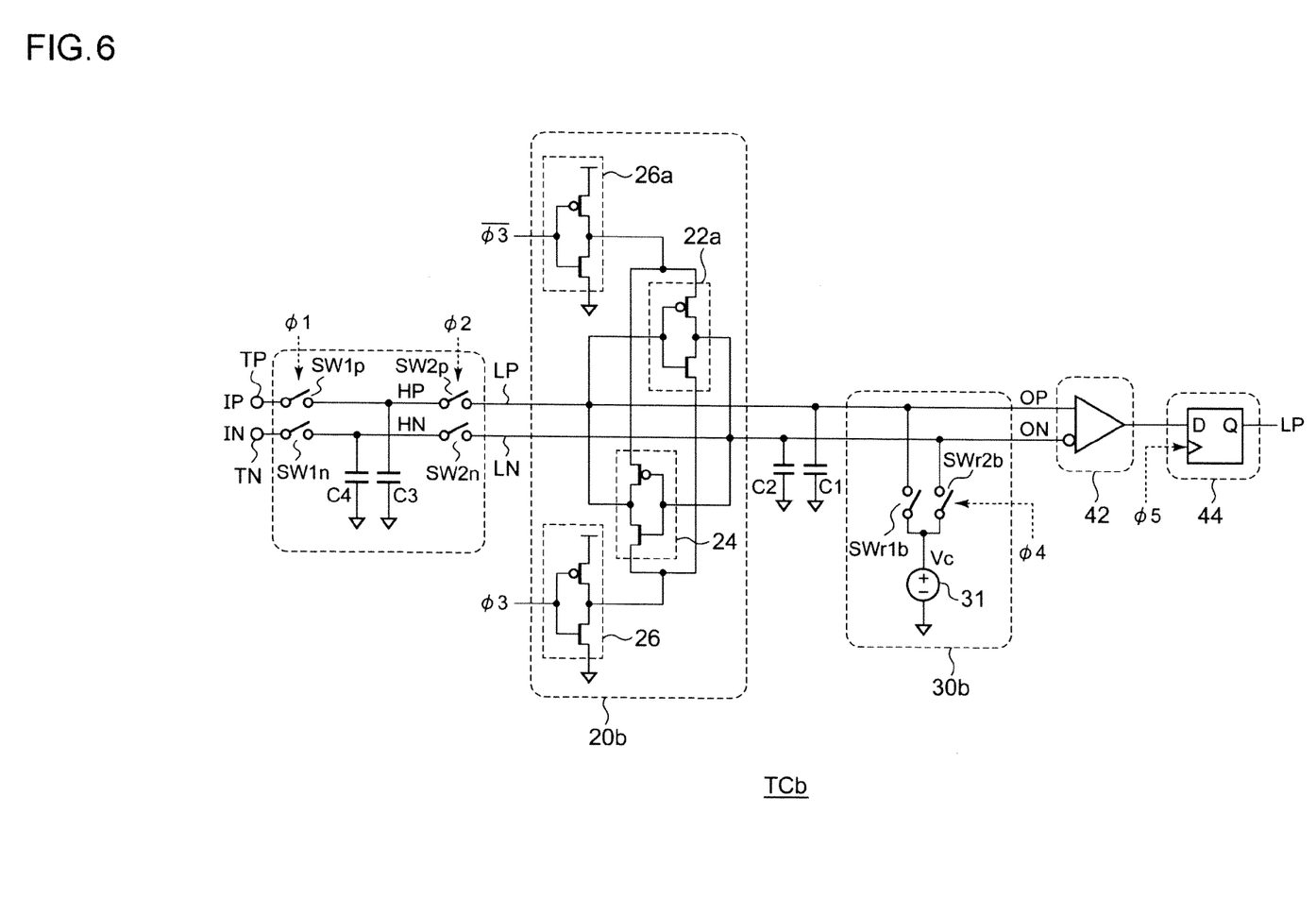
FIG. 6 is a circuit diagram illustrating the structure of a comparator according to a second variation.

FIG. 6 is a circuit diagram illustrating the structure of a comparator TCb according to a second variation. In the comparator TCb in FIG. 6, a comparison amplification unit 20b has the structure in which the comparison amplification unit 20 in FIG. 2 and the comparison amplification unit 20a in FIG. 4 are combined.

The reset unit 30b is provided to initialize the potential of the positive line LP (positive output signal OP) and the potential of the negative line LN (negative output signal ON) to a predetermined voltage Vc. The predetermined voltage Vc may be arbitrarily set, and may be set to, for example, the midpoint voltage of the power supply voltage vdd and the ground voltage VGND or the common voltage of the differential signal IP/IN. Hereinafter, Vc is referred to as a center voltage. The reset unit 30b includes a voltage supply 31 generating the center voltage Vc and reset switches SWr1b and SWr2b.

Figure 7:
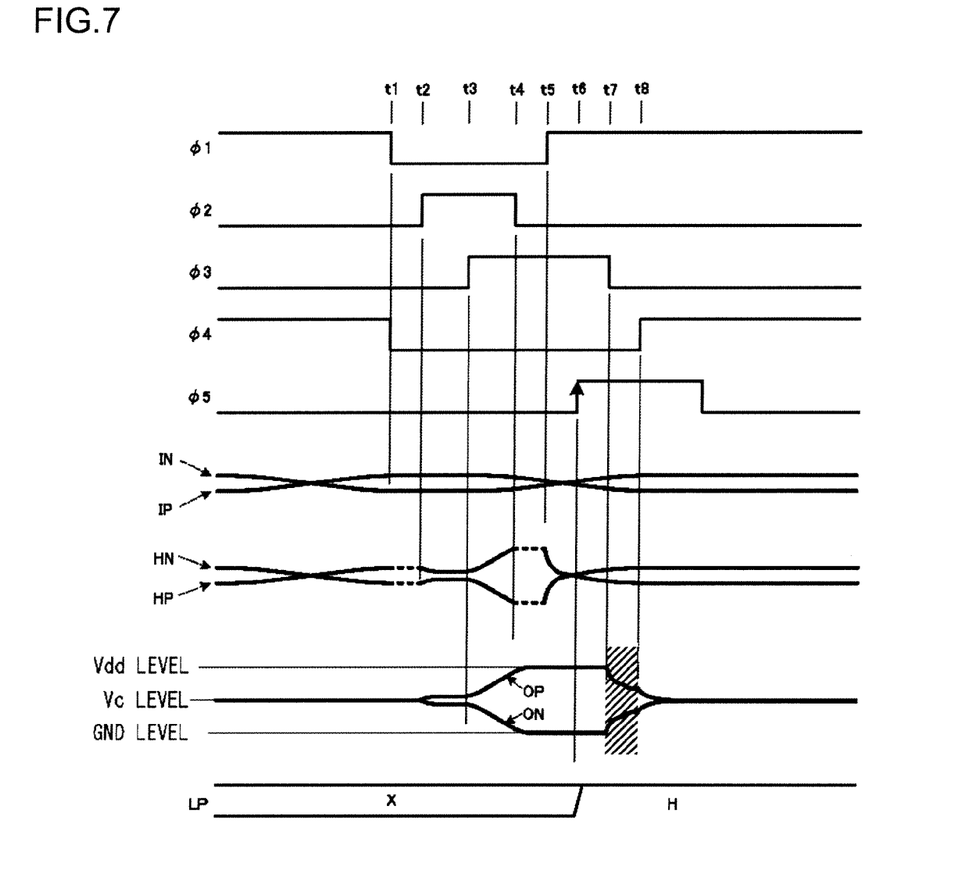
FIG. 7 is a time chart illustrating performance of the comparator in FIG. 6.

FIG. 7 is a time chart illustrating the performance of the comparator TCb in FIG. 6. Transition timings of each signal are the same as those in FIGS. 3 and 5. In the initial state before the time t1, because the potentials of the positive line LP and the negative line LN are initialized to the center voltage Vc between the high level and the low level, the case (1) where the differential signals IP/IN are at the high level and the case (0) where the signals are at the low level, can be equally evaluated. In the circuit illustrated in FIG. 7, it is preferable that the control signals φ3 and φ3# simultaneously make transitions at the time t3, and hence it is slightly difficult to adjust the timings thereof; however, the above advantage far outweighs this difficulty.

Figure 8:
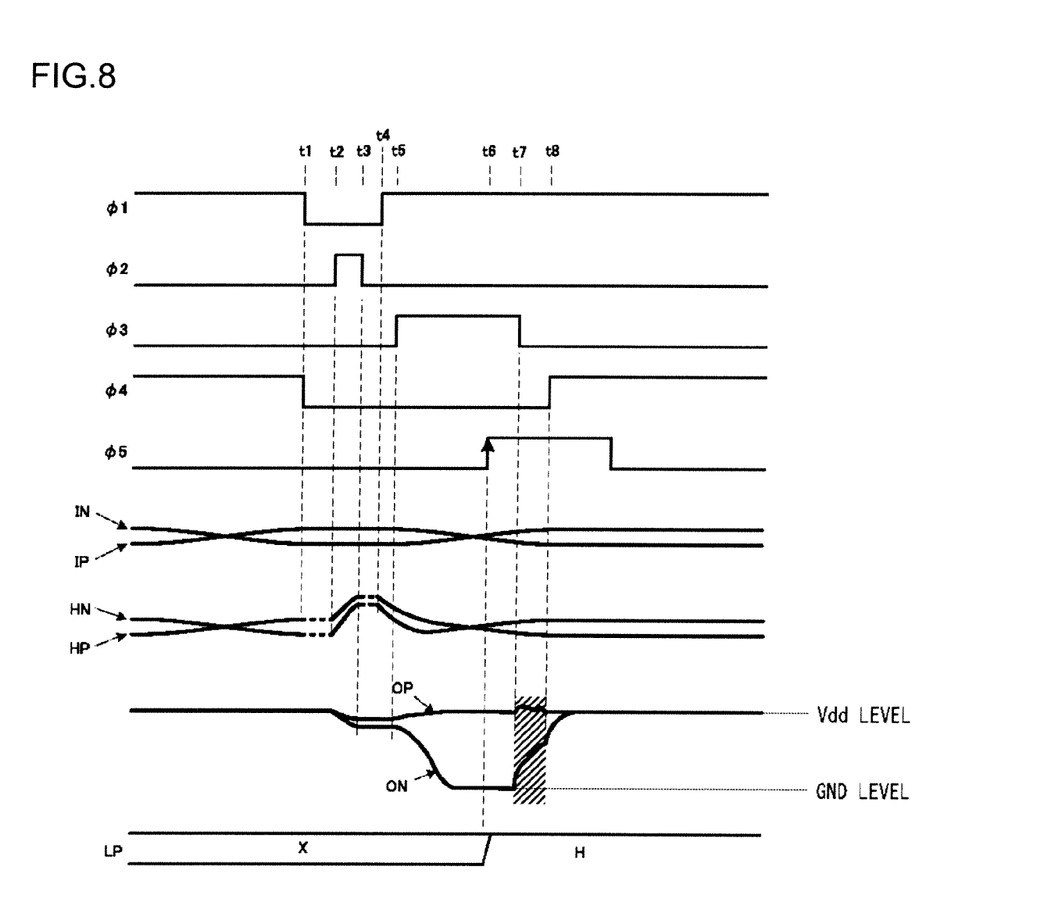
FIG. 8 is a second time chart illustrating performance of the comparator in FIG. 2.

FIG. 8 is a second time chart illustrating the performance of the comparator TC in FIG. 8. The structure of FIG. 2 is the same as that stated above.

The state before the time t2 is the same as that in FIG. 3. In the time charts in FIGS. 3 and 8, when the control signal φ2 makes a transition to the high level at the time t2, the second positive switch SW2p and the second negative switch SW2n are turned on, allowing charges to be transferred between the capacitors located before and after the comparison amplification unit 20.

In the time chart illustrated in FIG. 8, when the second control signal φ2 makes a transition to the low level at the time t3, the second positive switch SW2p and the second negative switch SW2n are turned off. That is, the input hold unit 10 is separated from the comparison amplification unit 20.

Subsequently, when the first control signal φ1 makes a transition to the high level at the time t4, the input hold unit 10 is brought back to the tracking state.

Subsequently, when the third control signal φ3 makes a transition to the high level at the time t5, the comparison amplification unit 20 is activated. The subsequent performance is the same as that of the time chart in FIG. 3.

As stated above, even if transition timings of some control signals are changed, the comparator TC can sample the differential signals IP/In. It is noted that a person skilled in the art can understand that the time chart illustrated in FIG. 8 is applicable to the comparators TCa and TCb illustrated in FIGS. 4 and 6.

Figure 9:
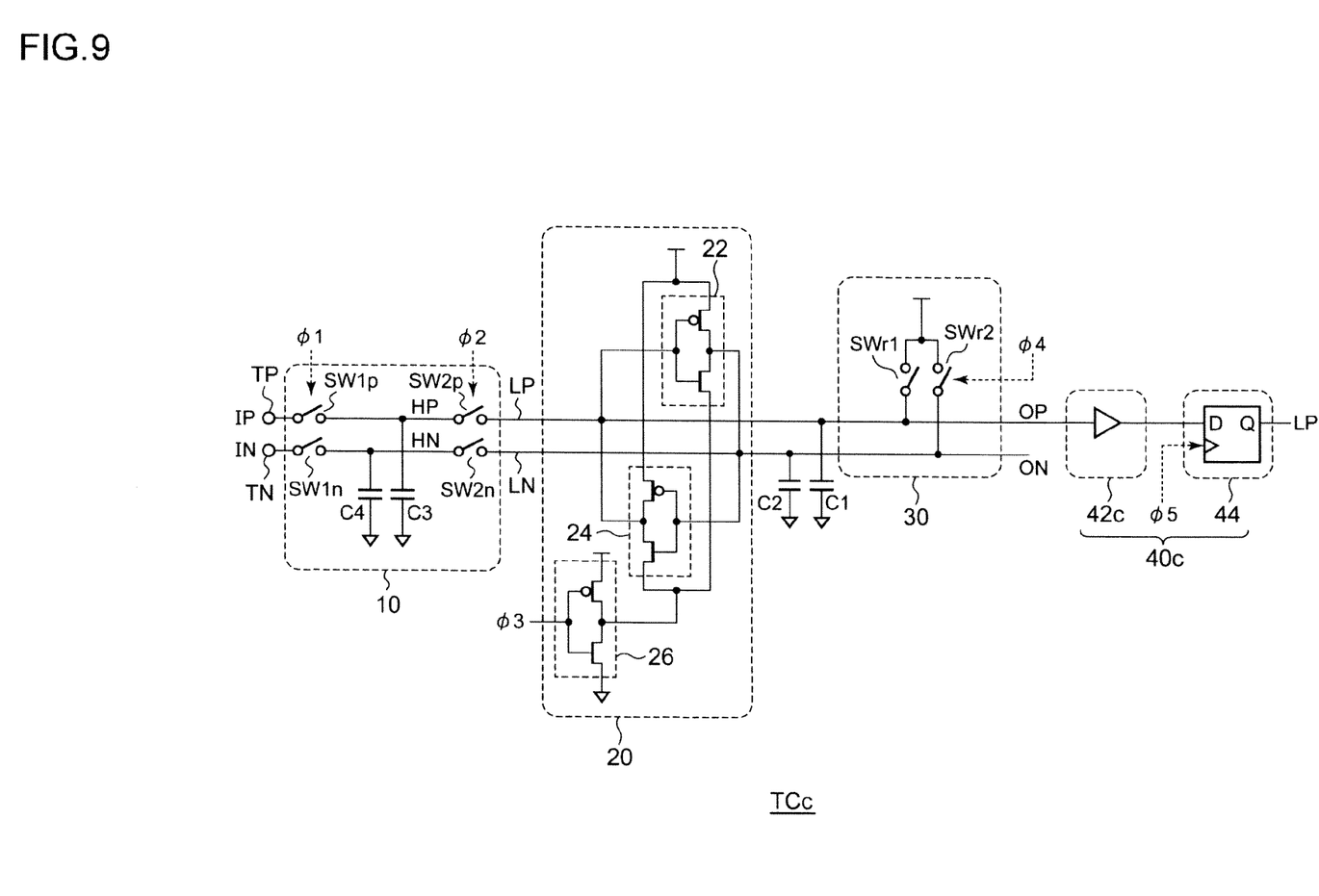
FIG. 9 is a circuit diagram illustrating the structure of a comparator according to a third variation.

FIG. 9 is a circuit diagram illustrating a comparator TCc according to a third variation. The comparator TCc in FIG. 9 is different from the comparator TC in FIG. 2 in the structure of the output unit 40c. Specifically, the comparator TCc is provided with a level shifter (or buffer) 42c instead of the comparator element that generates a signal corresponding to the potential difference between the positive output signal OP and the negative output signal ON. The level shifter 42c receives one of the signals OP/ON (OP in FIG. 9) of the positive line LP and the negative line LN and shifts a voltage level of the received signal to the voltage level suitable for the circuit in the subsequent stage. The level shifter may also latch and output the negative output signal ON. The variation in FIG. 9 is also applicable to the comparators TCa and TCb in FIGS. 4 and 6, respectively. That is, any form of the circuit in the stage subsequent to the reset unit 30 is possible.

Figure 10:
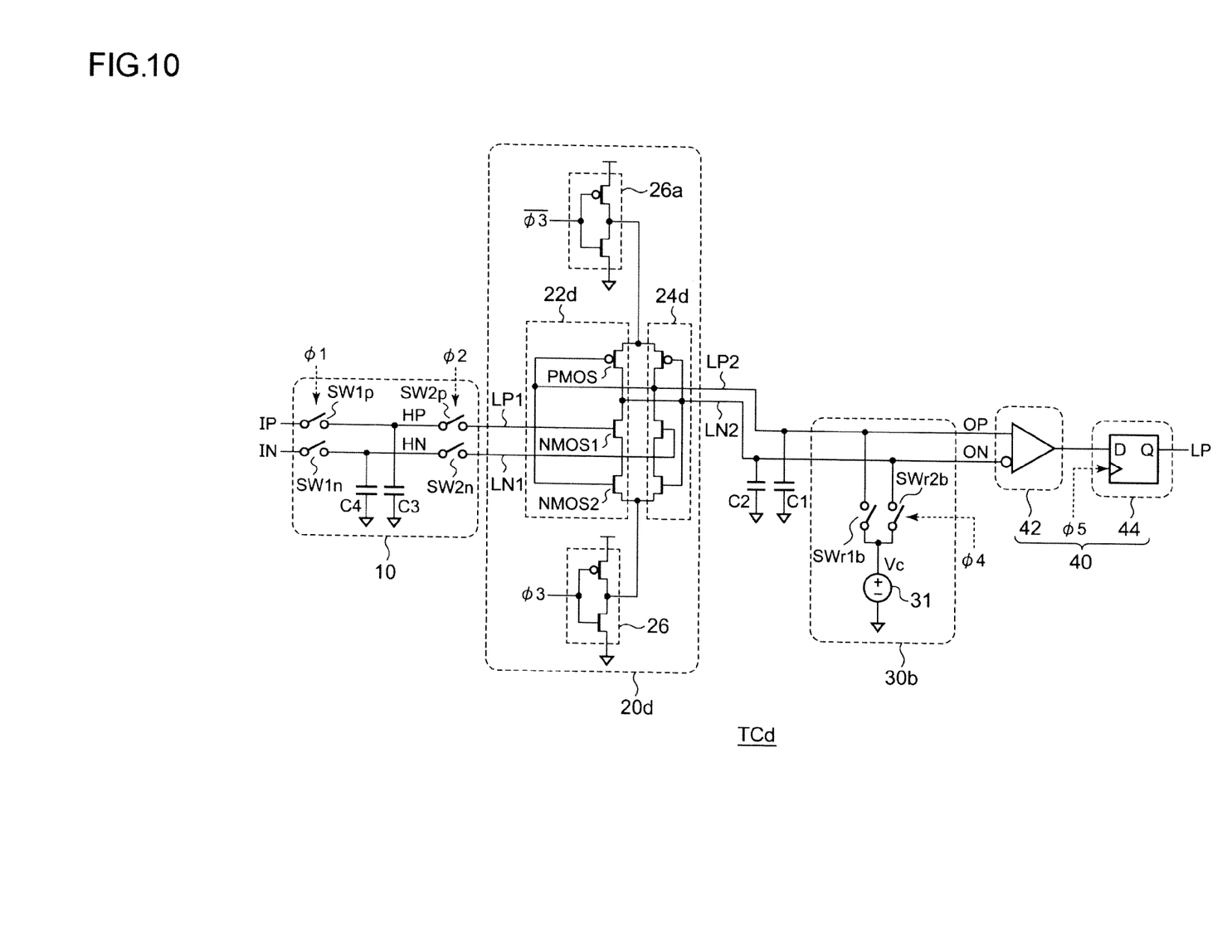
FIG. 10 is a circuit diagram illustrating the structure of a comparator according to a fourth variation.

FIG. 10 is a circuit diagram illustrating a structure of a comparator TCd according to a fourth variation. The comparator TCd in FIG. 10 will be described with respect to the difference from the comparator TCb in FIG. 6. The positive line LP1 on the input side and the positive line LP2 on the output side are separated, and the negative line LN1 on the input side and the negative line LN2 on the output side are separated, by the comparison amplification unit 20d in FIG. 10. The first inverter 22d receives a signal in the positive line LP1 and outputs it to the negative line LN2. The second inverter 24d receives a signal in the negative line LN1 and outputs it to the positive line LP2.

The first inverter 22d comprises transistors PMOS, NMOS1 and NMOS2. The first inverter 22d performs an inverse amplification on the signal inputted to the gate of the transistor NMOS1 and outputs it from the drain thereof (drain of the PMOS). The gates of the transistors PMOS and NMOS2 are connected in common and biased by the output signal OP from the second inverter 24d. The second inverter 24d is structured in the same way as the first inverter 22d and connected symmetrically to the first inverter 22d.

Figure 11:
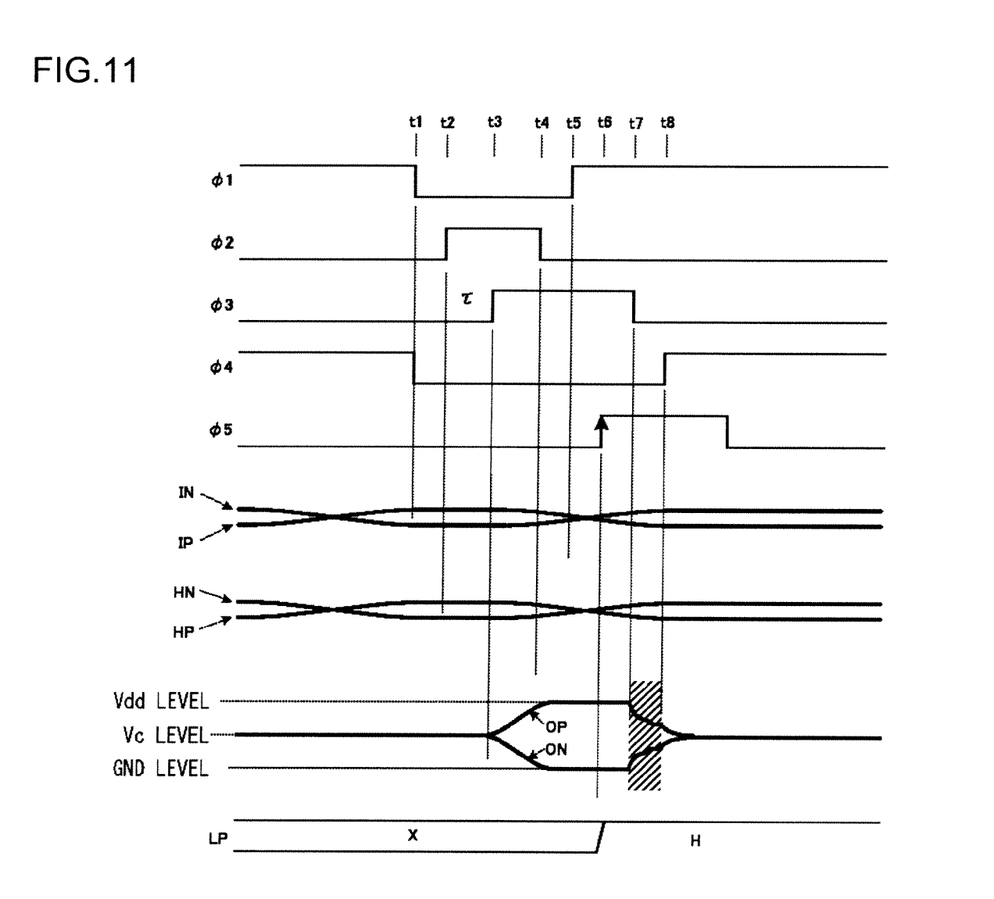
FIG. 11 is a time chart illustrating performance of the comparator in FIG. 10.

Subsequently, the performance of the comparator TCd in FIG. 10 will be described. FIG. 11 is a time chart illustrating the performance of the comparator TCd in FIG. 10.

In the comparator TCd in FIG. 10, because the input side and the output side of the first inverter 22d and the second inverter 24d are separated from each other, there are no steps in which charges are distributed between the first and third capacitors C1 and C3, and between the second and fourth capacitors C2 and C4. In other words, the input capacitance of the comparison amplification unit 20 is smaller as compared with the structure in FIG. 6 or other structures. Therefore, the time difference τ between the rise of the second control signal φ2 (positive edge: at the time t2) and that of the third control signal φ3 (at the time t3) can be shortened.

A performance speed of the stand-alone comparison amplification unit 20d in FIG. 10 is slower than that of the stand-alone comparison amplification unit 20b in FIG. 6; however, when comparing the performance speed of the whole comparator TCd, a high-speed performance can be obtained by shorting the time difference τ.

When there is a mismatch between the threshold voltages of the respective transistors NMOS1 in the inverters 22d and 24d that are used for the input unit of the comparison amplification unit 20d, the mismatch is, as it is, added to an input offset voltage of the comparator. However, when using the comparator TCd for a semiconductor test apparatus, the offset can be cancelled by initializing the apparatus, resulting in a less major issue.

The following variations are possible for the comparator TCd in FIG. 10:

1. a structure in which, in the same way as FIG. 2, the power supply terminals (source of the PMOS) of the first and second inverters 22d and 24d are fixed to the first fixed voltage (power supply voltage Vdd), and the potentials of the positive line LP and the negative line LN are reset to the first fixed voltage (power supply voltage Vdd) by the reset unit 30; and 2. a structure in which, in the same way as FIG. 4, the power supply terminals (source of the NMOS) of the first and the second inverters 22d and 24d are fixed to the first fixed voltage (ground voltage VGND), and the potentials of the positive line LP and the negative line LN are reset to the first fixed voltage (ground voltage VGND) by the reset unit 30a.

While the preferred embodiments of the present invention have been described using specific terms, such description is for illustrative purposes only, and it is to be understood that changes and variations may be made without departing from the spirit or scope of the appended claims.

What is claimed is:

1. A comparator with a latching function that receives a pair of differential signals consisting of a positive differential signal and a negative differential signal, and that determines an amplitude level of the pair of differential signals at a predetermined timing and latches a signal indicating a determination result, the comparator comprising:

a positive input terminal to which the positive differential signal is inputted;

a negative input terminal to which the negative differential signal is inputted;

a first fixed voltage terminal to which a first fixed voltage is supplied;

a second fixed voltage terminal to which a second fixed voltage is supplied;

a positive line in which the positive differential signal is propagated;

a negative line in which the negative differential signal is propagated; and a comparison amplification unit that compares a level of a signal in the positive line with that of the signal in the negative line and latches a comparison result, wherein the comparison amplification unit includes:

a first inverter, an input terminal of which is connected to the positive line, an output terminal of which is connected to the negative line, and a power supply terminal on one side of which is connected to the first fixed voltage terminal;

a second inverter, an input terminal of which is connected to the negative line, an output terminal of which is connected to the positive line, and a power supply terminal on one side of which is connected to the first fixed voltage terminal; and a first activation switch that can selectively switch between a state where the first activation switch outputs the first fixed voltage to the other power supply terminals of the first and second inverters that are connected in common, such that the comparison amplification unit is inactivated, and a state where the first activation switch outputs the second fixed voltage such that the comparison amplification unit is activated, and wherein the comparison amplification unit outputs a signal corresponding to at least one of the signal in the positive line and the signal in the negative line at a timing after the comparison amplification unit is activated.

2. The comparator with a latching function according to claim 1 further comprising an input hold unit that is provided in a stage anterior to the comparison amplification unit, and that switches connection and disconnection between the positive input terminal and the positive line and between the negative input terminal and the negative line.

3. The comparator with a latching function according to claim 2 executing the steps of:
the input hold unit disconnecting between the positive input terminal and the positive line and between the negative input terminal and the negative line, and the comparison amplification unit being inactivated;
the input hold unit supplying the positive differential signal to the positive line, and the negative differential signal to the negative line;
activating the comparison amplification unit;
the input hold unit disconnecting between the positive input terminal and the positive line and between the negative input terminal and the negative line; and
outputting an output signal from the comparison amplification unit to a circuit in a subsequent stage.

4. The comparator with a latching function according to claim 3 further comprising a reset unit that initializes each potential of the positive line and the negative line to the first fixed voltage, wherein the comparator further executes the step of the reset unit initializing the potentials of the positive line and the negative line after outputting an output signal from the comparison amplification unit to a circuit in the subsequent stage.

5. The comparator with a latching function according to claim 2 executing the steps of:
the input hold unit disconnecting between the positive input terminal and the positive line and between the negative input terminal and the negative line, and the comparison amplification unit being in an inactivated state;
the input hold unit supplying the positive differential signal to the positive line, and the negative differential signal to the negative line;
the input hold unit disconnecting between the positive input terminal and the positive line and between the negative input terminal and the negative line;
activating the comparison amplification unit; and
outputting an output signal from the comparison amplification unit to a circuit in a subsequent stage.

6. The comparator with a latching function according to claim 5 further comprising a reset unit that initializes each potential of the positive line and the negative line to the first fixed voltage, wherein the comparator further executes the step of the reset unit initializing the potentials of the positive line and the negative line after outputting an output signal from the comparison amplification unit to a circuit in the subsequent stage.

7. The comparator with a latching function according to claim 2, wherein the input hold unit further has a function of holding the positive differential signal and the negative differential signal at a specified timing.

8. The comparator with a latching function according to claim 1 further comprising a reset unit that initializes each potential of the positive line and the negative line to the first fixed voltage.

9. The comparator with a latching function according to claim 1, wherein the comparison amplification unit further includes a second activation switch that applies the first or second fixed voltage to the power supply terminals on one sides of the first and second inverters that are connected in common.

10. The comparator with a latching function according to claim 9 further comprising a reset unit that initializes each potential of the positive line and the negative line to a predetermined voltage.

11. The comparator with a latching function according to claim 1, wherein the comparison amplification unit is a dynamic comparator that separates a positive line on the input side and a positive line on the output side, and that separates a negative line on the input side and a negative line on the output side.

12. The comparator with a latching function according to claim 1 further comprising a comparator element that compares the signal in the positive line with the signal in the negative line, and that outputs a comparison result to a circuit in a subsequent stage.

13. The comparator with a latching function according to claim 1 further comprising a buffer circuit that receives one of the signal in the positive line and the signal in the negative line, and that outputs a signal corresponding to the signal to a circuit in a subsequent stage.

14. A test apparatus comprising the comparator with a latching function according to claim 1, which receives a differential signal outputted from a device under test.

* * * * *